United States Patent [19]

Bogholtz, Jr. et al.

[11] Patent Number: 4,730,318
[45] Date of Patent: Mar. 8, 1988

[54] MODULAR ORGANIZED STORAGE TESTER

[75] Inventors: Richard Bogholtz, Jr., Mahopac; Louis J. Bosch, Hopewell Junction, both of N.Y.

[73] Assignee: International Business Machines Corporation, Armonk, N.Y.

[21] Appl. No.: 934,046

[22] Filed: Nov. 24, 1986

[51] Int. Cl.$^4$ .................... G01R 31/28; G06F 11/00
[52] U.S. Cl. ........................... 371/27; 371/5; 371/21
[58] Field of Search ............... 371/21, 5, 25, 20, 22, 371/10, 27, 67, 68; 324/73 R, 73 AT, 73 PC; 364/200, 900

[56] References Cited

U.S. PATENT DOCUMENTS

| | | | |
|---|---|---|---|
| 4,078,254 | 3/1978 | Beausoleil et al. | 364/900 |
| 4,257,108 | 3/1981 | Igel | 364/900 |
| 4,287,594 | 9/1981 | Shirasaka | 371/25 |
| 4,317,200 | 2/1982 | Wakatsuki et al. | 371/25 |
| 4,369,511 | 1/1983 | Kimura et al. | 371/21 |
| 4,389,723 | 6/1983 | Nigorikawa et al. | 371/27 |
| 4,428,076 | 1/1984 | Schuon | 371/5 |
| 4,433,414 | 2/1984 | Carey | 371/27 |
| 4,450,560 | 5/1984 | Conner | 371/25 |
| 4,451,918 | 5/1984 | Gillette | 371/27 |
| 4,456,995 | 6/1984 | Ryan | 371/5 |
| 4,529,891 | 7/1985 | Oida | 307/355 |
| 4,635,261 | 1/1987 | Anderson | 371/27 |
| 4,682,330 | 7/1987 | Millham | 371/27 |
| 4,696,005 | 9/1987 | Millham | 371/27 |

*Primary Examiner*—Michael R. Fleming
*Attorney, Agent, or Firm*—Robert J. Haase; John D. Crane

[57] ABSTRACT

A tester of circuit devices is disclosed which uses commercially available component parts but is capable of high performance testing of hierarchical memory cards requiring data pulses of variable pulse widths at high repetition rates. The tester includes two memories connected to respective shift registers which in turn, feed a multiplexer. The memories handle test timing patterns for respective halves of the basic clock test cycle and are interleaved in operation along with the shift registers. Two opposite-phased outputs of the multiplexer are applied through respective programmable delay networks and pulse generators to the set and reset inputs of a trigger circuit. The trigger circuit provides test data to a dedicated input pin of the device under test.

8 Claims, 2 Drawing Figures

MODULAR ORGANIZED STORAGE TESTER

BACKGROUND OF THE INVENTION

The present invention generally relates to high performance testers for memory hierarchy cards and, more particularly, to such testers capable of running at speeds of the order of 100 MHz using only off-the-shelf commercially available component parts.

Current high performance computer system memories are being architected in increasingly sophisticated manners. Logic is being included for fault alignment exclusion and for sparing techniques designed to make the memories more fault tolerant. Additionally, there is hierarchical circuit structure within the memory subsystem itself. Thus, the memory system includes substantial logic as well as memory on a card that must be tested together, thus necessitating a high speed digitized pulse generator providing large pulse widths for the slower portions of the hierarchical memory along with much narrower pulse widths for the faster memory portion.

More particularly, there are effectively three memories in a typical card-mounted multi-level memory, i.e., a high speed static write memory, a high speed static read memory and a dynamic array memory which is about an order of magnitude slower than the other two memories. On a Write command, the entire contents of the write memory is written broadside into the address specified in the array memory. On a Read command, the contents of the array memory at the address specified is read out broadside into the read memory. During the fast memory cycles, the write memory is loaded and the read memory is read out at memory cycle speeds of the order of 100 MHz.

The relative speed difference of an order of magnitude between the slow and fast memory cycles, the unrestricted overlap of the Read and Write cycles of the static fast arrays and the somewhat restricted overlap with the slower array memory cause testing problems. Presently available test equipment is not fast enough and is architecturally incompatible with hierarchical memory testing in that the relationship is interlocked among generated cycle, timing edges and data which impedes the generation of simultaneously and overlapped control pulses and data for the faster and slower memories.

Attempts have been made to modify existing slow testers by adding a high performance adapted to interface with the memory to be tested. A typical approach is to run the slower tester at a submultiple of the faster static arrays and to design the adapter to fill in the time gaps. Such a technique suffers the following penalties: (1) It is costly and development time is long. (2) The modified tester is tailored to a specific application and is seldom reusable elsewhere. (3) Compromises are resorted to in the desired testing functions. (4) Any changes in the memory interface during the development cycle of the product to be tested could cause a major change in the adapter design. (5) The development cost of the adapter approaches the cost of the tester as the performance gap between the tester and the memory cards continues to widen.

In order to reduce the time required to exchange information between the tester and the accessing nodes of the device under test, a single local memory has been proposed for each data channel in the tester. This enhances the speed with which a device may be tested in that the various data channels can be operated simultaneously rather than sequentially by virtue of their local memory, as discussed in U.S. Pat. No. 4,433,414, issued Feb. 21, 1984 to M. E. Carey.

U.S. Pat. No. 4,287,594, issued Sept. 1, 1981 shows the use of two local memories in a single data channel tester for testing an integrated circuit. The two memories are read out simultaneously into associated temporary storage shift registers. The storage registers are accessed in alternation by a multiplexer which receives data in parallel from each shift register and converts it into serial form. Due to the simultaneous data entry into the temporary storage registers, it is necessary to wait for the settling of transients in each data entry cycle before the stored data is accessed by the multiplexer which causes wasteful delay in each operating cycle.

U.S. Pat. No. 4,451,918, issued May 29, 1984 to G. C. Gillette, further shows the use of two local memories in a single data channel tester in which the local memories are loaded with data in an interleaved fashion, i.e., one memory provides test data to the device under test while the other memory is loaded with new data from a selected one of back-up memories. In this way, continuous delivery at high rates of long sequences of test signals is provided to the device under test without requiring pauses to relaod the local memories. However, the single data channel is multiplexed among the device pins and no provision is made for providing output data pulses of variable pulse widths at high repetition rates.

SUMMARY OF THE INVENTION

A tester of circuit devices such as, for example, memory hierarchy cards, comprising two register stacks or memories connected to respective shift registers which run at one half the test system clock rate feed a multiplexer which runs at full clock rate. The operations of the register stacks are interleaved, with each stack handling test timing patterns for respective halves of the basic clock test cycle. Variable width timing channel pulses at up to very high repetition rates are generated by means of programmable delays and pulse generators at the output of the multiplexer, for testing the different levels of the memory hierarchy. One timing channel is provided for each tester output pin, the timing channels being synchronized with each other by a single basic clock so that sufficient timing channels and test patterns are made available in parallel to the memory device under test.

BEST MODE FOR CARRYING OUT THE INVENTION

Figure 1:
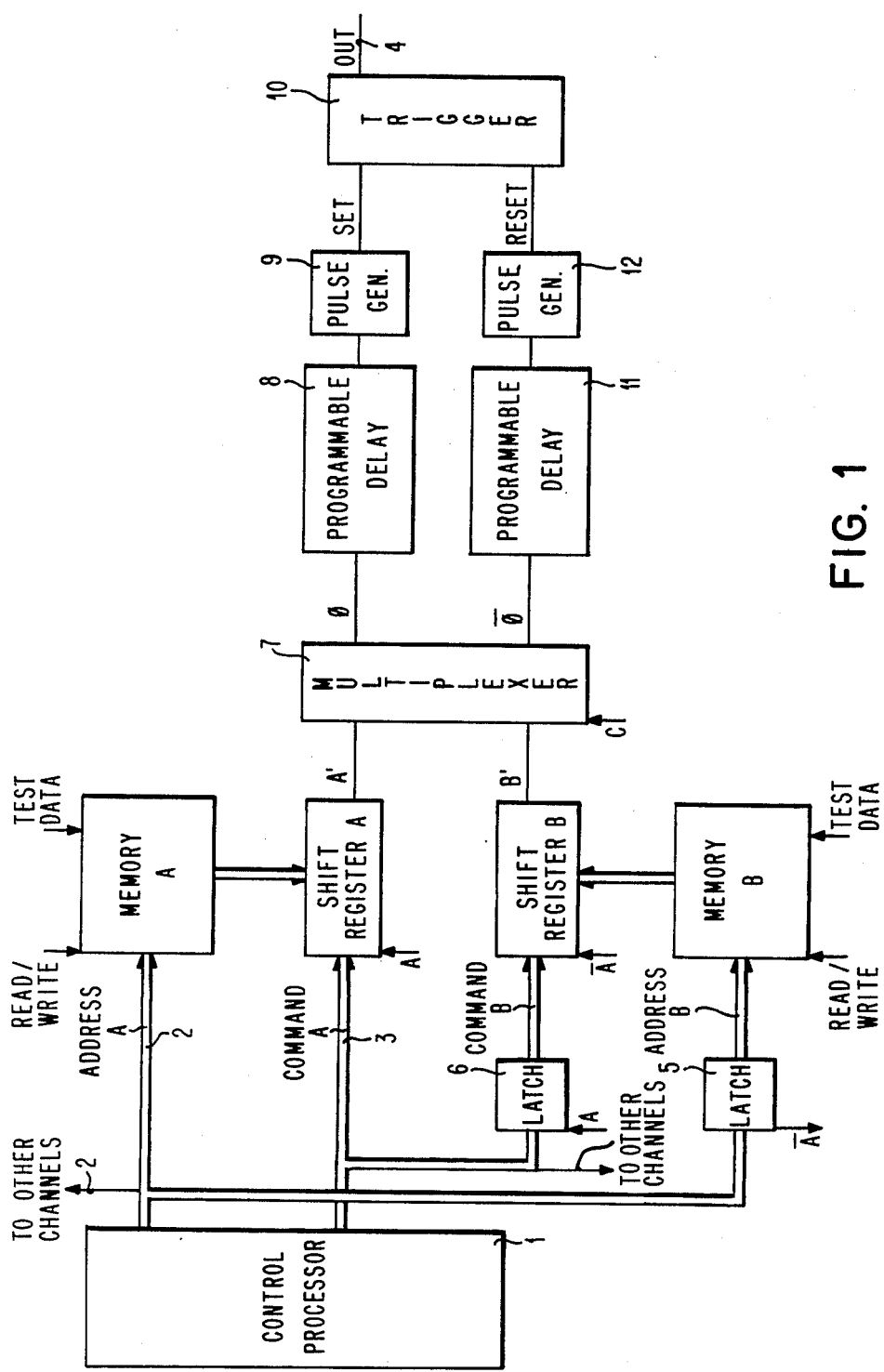
FIG. 1 is a block diagram of the components comprising the tester of the present invention.

The tester of the present invention is implemented in a hierarchical pipelined processing architectural, i.e., the overall testing procedure is divided into many parts which are parcelled out to separate groups of channels, one channel of which is shown in FIG. 1. The individual channels of a group are maintained in synchronization with each other by control processor 1 which provides address data on line 2 and command data on line 3 to each channel of the group. Each synchronized channel produces output pulses of desired pulse width on output line 4, in a manner to be described, for application to a respective input pin of the device under test (not shown). The actual response of the device under test to each set of pulses on the tester output lines (such as line 4) is compared with the expected response stored in control processor 1 to determine proper functioning of the device under test. Such comparison of actual and expected responses, per se, is a well-understood testing technique and, for that reason, will not be further described here.

The address data on line 2 is applied to local memory A and, via latch 5, to local memory B. The command data on line 3 is applied to shift register A and, via latch 6, to shift register B. Memories A & B are pre-programmed to store data at respective addresses for generating test timing patterns to be applied to the device under test (connected to output line 4) during respective halves of the basic clock test cycle. The basic clocks comprise signals A, not A($\overline{A}$) and C, the latter being a delayed A clock. As a result of the A clock being applied to register A, the $\overline{A}$ clock being applied to register B and the triggering of the latches and shift registers on the positive-going clock pulse edges, memory and shift register A are interleaved in operation with memory and shift register B. Furthermore, the commands and addresses to shift register B and memory B are latched to be 180° out of phase with the commands and addresses to shift register A and memory A.

The outputs A' and B' from shift registers A and B are applied to C clock-driven multiplexer 7. The in-phase output $\phi$ from multiplexer 7 is directed through programmable delay and pulse generator 9 to set trigger 10. The out-of-phase output $\overline{\phi}$ correspondingly is applied via programmable delay 11 and pulse generator 12 to reset trigger 10. Multiplexer 10 receives serial outputs A' and B' from registers A and B and selects each of A' and B' in alternation after a delay determined by the fixed delay between clocks A and C. The fixed delay is sufficient to allow for the settling of transients following each parallel loading of the shift registers from their respective memories A and B. Since the registers are loaded 180° out of phase with respect to each other, multiplexer 7 selects from A' during the transient settlement time of B' and vice-versa, so that multiplexer 7 can run at the full clock rate without suffering any waiting time loss due to transients. Clock C activates multiplexer 7 to take one-half a clock cycle portion from output A and one-half a clock cycle portion from output B. With the proper delay setting of clock C, any propagation variation in the system up to and including the shift registers can be absorbed and compensated for up to a total of one-half a clock cycle. Adding or subtracting a memory bit varies the pulse width at the output of multiplexer 7 by one-half of the clock cycle. In order to facilitate freedom of choice of starting and stopping the output pulse at any point within a clock cycle, the programmable delays 8 and 11 may be set in increments less than half a clock cycle.

It should be noted that only multiplexer 7 runs at full clock speed. The commands and addresses from processor 1 normally run at one-fourth clock speed.

Figure 2:
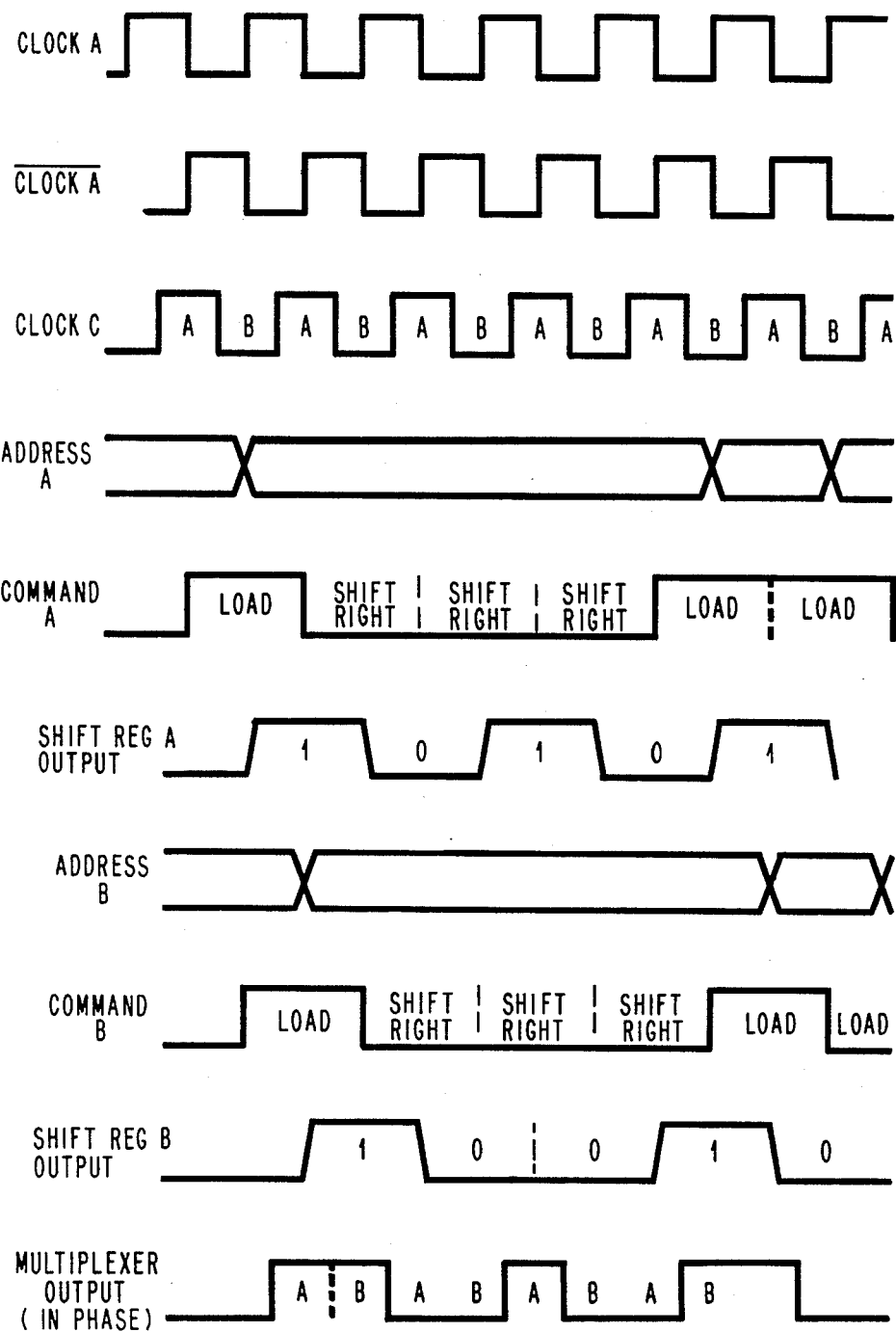
FIG. 2 is a series of idealized waveforms appearing at various locations of the block diagram of FIG. 1.

The operation of the tester channel discussed in connection with FIG. 1 may be better understood by reference to the idealized waveforms of FIG. 2 which occur with the relative time relationships shown and appear at the indicated places on the block diagram of FIG. 1.

What is claimed is:

1. Apparatus comprising;
   first and second memory means for addressably storing and supplying stored test data signals,
   first and second shift registers connected to receive said stored data signals from said first and second memory means, respectively,
   said registers serially shifting said received stored data signals onto first and second output lines in response to first and second clock pulses, respectively,
   said second clock pulses being delayed with respect to said first clock pulses,
   means for applying address signals to said first and second memory means and for applying command signals to said first and second shift registers, and
   a multiplexer connected to receive said data signals on said first and second output lines and operative to provide recurrent groups of interleaved data signals, each group comprising a serial succession of data signals from said first register followed by data signals from said second register in response to third clock pulses,
   said third clock pulses occurring between said first and second clock pulses.

2. The apparatus defined in claim 1 wherein the same address signals are applied to said first and second memory means.

3. The apparatus defined in claim 1 wherein the address signals applied to said second memory means are delayed relative to the address signals applied to said first memory means.

4. The apparatus defined in claim 1 wherein the command signals applied to said second shift register are delayed relative to the command signals applied to said first shift register.

5. The apparatus defined in claim 1 and further including a pulse generator and a programmable delay means for coupling said groups of data signals at the output of said multiplexer to said pulse generator.

6. The apparatus defined in claim 1 wherein said multiplexer provides said groups of data signals on each of two output lines in phase opposition with respect to each other and further including
   a pair of pulse generators and a pair of programmable delay means each delay means coupling one of said two output lines to a respective one of said pulse generators.

7. The apparatus defined in claim 6 and further including a set-reset trigger circuit, one of said pulse generators being connected to actuate the set input of said trigger circuit and the other of said pulse generators being connected to actuate the reset input of said trigger circuit.

8. A test apparatus for testing a multiple input pin device under test comprising a multiplicity of apparatuses as defined in claim 1, each apparatus being coupled to a respective input pin.

* * * * *